United States Patent
Nakatsu et al.

(10) Patent No.: US 7,557,646 B2
(45) Date of Patent: Jul. 7, 2009

(54) SEMICONDUCTOR DEVICE WITH NON-INTERSECTING POWER AND GROUND WIRING PATTERNS

(75) Inventors: Shinichi Nakatsu, Kanagawa (JP); Hideo Isogai, Kanagawa (JP); Takehiro Masumoto, Kanagawa (JP); Kazuyuki Nishizawa, Kanagawa (JP); Toshihide Tsuboi, Kanagawa (JP); Kimiharu Etou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 188 days.

(21) Appl. No.: 11/429,273

(22) Filed: May 8, 2006

(65) Prior Publication Data

US 2006/0261451 A1    Nov. 23, 2006

(30) Foreign Application Priority Data

May 9, 2005    (JP)    ............................. 2005-136439

(51) Int. Cl.
  *H01L 25/00*    (2006.01)
(52) U.S. Cl. ...................................... 327/565; 257/692
(58) Field of Classification Search ......... 327/564–566; 257/692–695; 326/21, 33, 38
  See application file for complete search history.

(56) References Cited

U.S. PATENT DOCUMENTS 5,684,411 A * 11/1997 Nepple ......................... 326/38
6,172,519 B1 * 1/2001 Chiang et al. ................. 326/38

FOREIGN PATENT DOCUMENTS

JP    2002-57418    2/2002

* cited by examiner

*Primary Examiner*—Lincoln Donovan
*Assistant Examiner*—An T Luu
(74) *Attorney, Agent, or Firm*—Young & Thompson

(57) ABSTRACT

A semiconductor circuit is installed on a printed circuit board having a power wiring pattern and a ground wiring pattern that do not intersect. The semiconductor circuit includes a first power supply terminal and a first ground terminal for a first side of the semiconductor circuit, and a second power supply terminal and a second ground terminal for a second side opposing to the first side. The direction from the first power supply terminal to the first ground terminal is the same as the direction from the second power supply terminal to the second ground terminal.

8 Claims, 9 Drawing Sheets

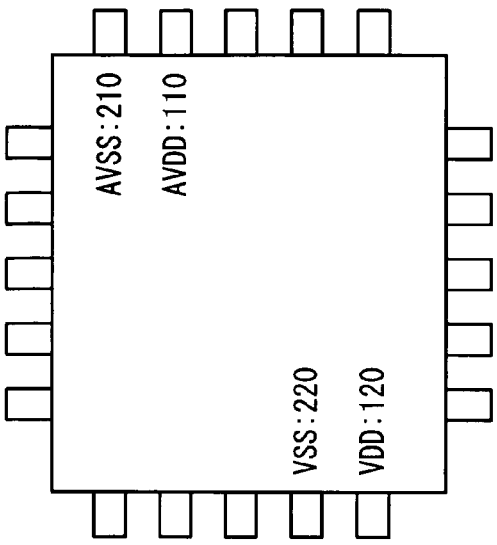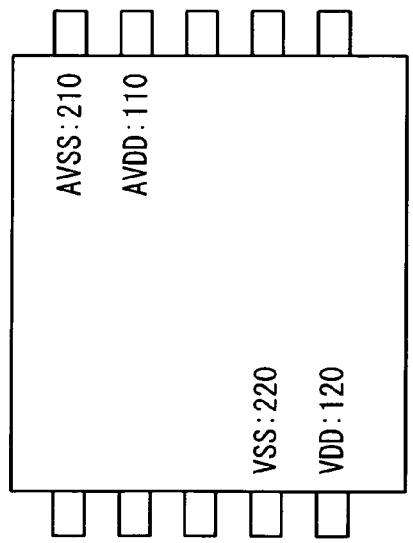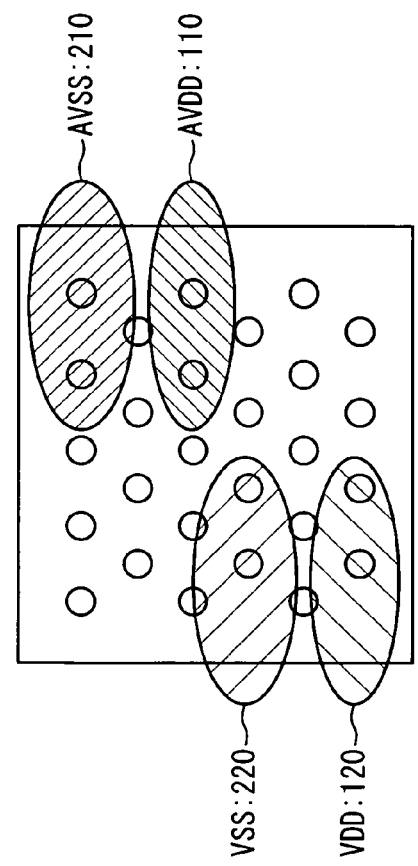

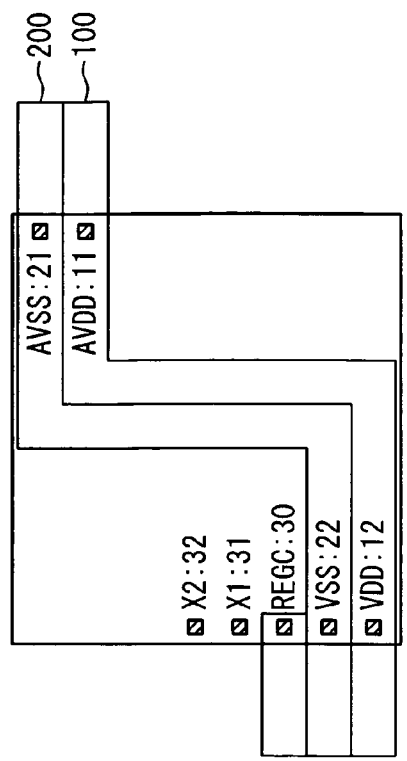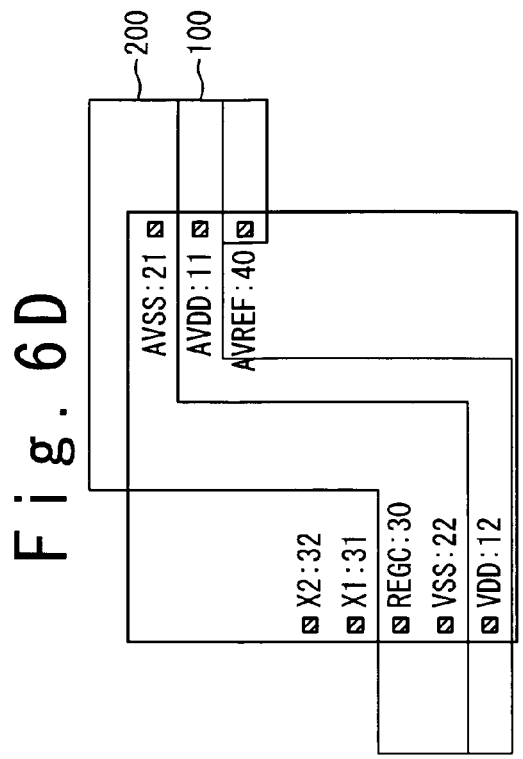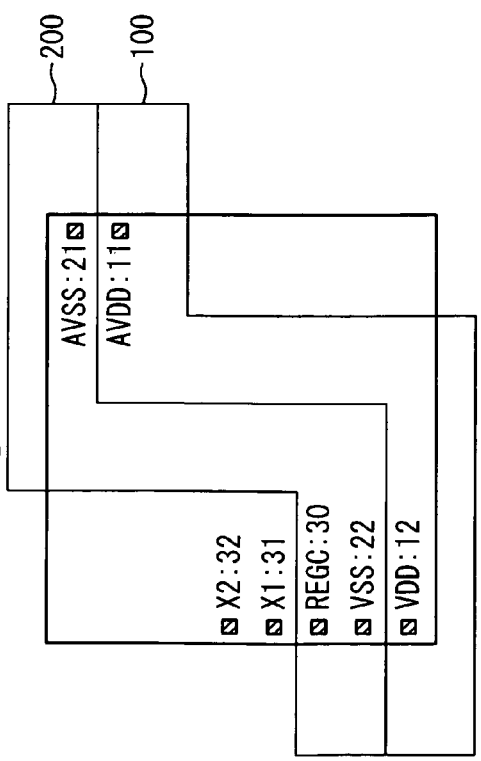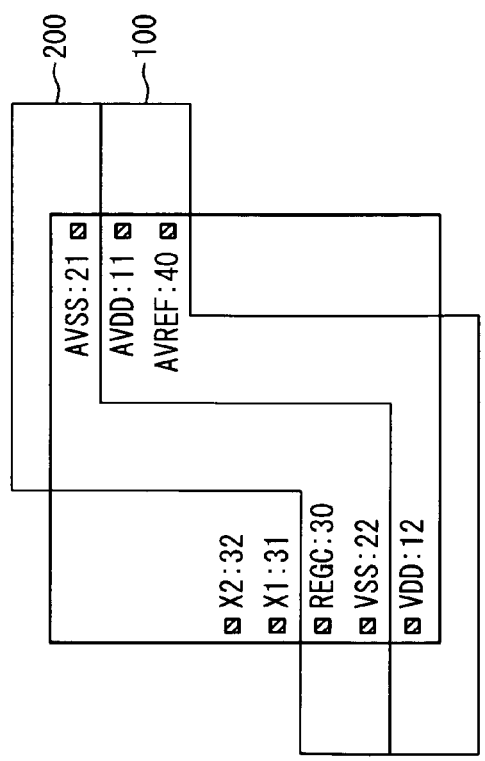

SEMICONDUCTOR DEVICE WITH NON-INTERSECTING POWER AND GROUND WIRING PATTERNS

BACKGROUND OF THE INVENTION

1. Field of the Invention

The present invention relates to a semiconductor circuit, and more particularly relates to a semiconductor circuit with a plurality of power supply terminals.

2. Description of the Related Art

A semiconductor IC (integrated circuit) chip is packaged by use of a QFP (Quad Flat Package) package or a SSOP (Shrink Small Outline Package) package in many cases. In case of the QFP package, leads for external input and output are provided on four sides of the package, and in case of the SSOP package, leads are provided on two sides of the package.

The arrangement of power supply terminals and ground terminals in a package with a conventional semiconductor circuit chip 300 will be described with reference to FIG. 1A. Conventionally, a package 1000 with the semiconductor circuit chip 300 is connected to a different semiconductor chip (not shown) on a printed circuit board in order to configure a system. The printed circuit board has a VDD power supply wiring 100 and a VSS power supply wiring 200, which are used to supply power to the semiconductor circuit chip 300. The package 1000 with the semiconductor circuit chip 300 usually includes a first power supply terminal (AVDD) 110 and a first ground terminal (AVSS) 210, which are used to supply a voltage to an analog circuit, and a second power supply terminal (VDD) 120 and a second ground terminal (VSS) 220, which are used to supply a voltage to a digital circuit. Even when the same voltage is supplied to the first power supply terminal (AVDD) 110 and the second power supply terminal (VDD) 120, those terminals are separated as different terminals due to noise countermeasure. Similarly, they are separated as terminals different from the first ground terminal (AVSS) 210 and the second ground terminal (VSS) 220. The first power supply terminal (AVDD) 110 and the second power supply terminal (VDD) 120 are connected at the tip portions of the terminals (leads) to the VDD power supply wiring 100 on the printed circuit board. Similarly, the first ground terminal (AVSS) 210 and the second ground terminal (VSS) 220 are connected at the tip portions of the terminals to the VSS power supply wiring 200 on the printed circuit board. Also, the first power supply terminal (AVDD) 110 is bonded to an electrode pad (AVDD) 11 on the semiconductor circuit chip 300, and the second power supply terminal (VDD) 120 is bonded to an electrode pad (VDD) 12 on the semiconductor circuit chip 300. Similarly, the first ground terminal (AVSS) 210 is bonded to an electrode pad (AVSS) 21 on the semiconductor circuit chip 300, and the second ground terminal (VSS) 220 is bonded to an electrode pad (VSS) 22 on the semiconductor circuit chip 300.

When the package 1000 is assumed to be rectangular, the first power supply terminal (AVDD) 110 and the first ground terminal (AVSS) 210 are arranged on a first side of the package 1000, and the second power supply terminal (VDD) 120 and the second ground terminal (VSS) 220 are arranged on a second side opposing to the first side. Here, the words of the arrangement on the side include a case of the arrangement along the side. Also, the package 1000 has a first corner section and a second corner section which are located on a diagonal line of the rectangle, and the first power supply terminal (AVDD) 110 and the first ground terminal (AVSS) 210 are arranged near the first corner section, and the second power supply terminal (VDD) 120 and the second ground terminal (VSS) 220 are arranged near the second corner section. Moreover, the first power supply terminal (AVDD) 110, the first ground terminal (AVSS) 210, the second power supply terminal (VDD) 120 and the second ground terminal (VSS) 220 are arranged such that a direction from the first power supply terminal (AVDD) 110 to the first ground terminal (AVSS) 210 and a direction from the second power supply terminal (VDD) 120 to the second ground terminal (VSS) 220 are different. At this time, the VDD power supply wiring 100 and the VSS power supply wiring 200 become in the state in which they intersect each other.

FIG. 1B shows a sectional view of a portion at which the VDD power supply wiring 100 and the VSS power supply wiring 200 intersect. Here, at the portion at which the VDD power supply wiring 100 and the VSS power supply wiring 200 intersect, the VSS power supply wiring 200 is connected to a VSS power supply wiring 202 arranged in a different wiring layer through a contact portion 201.

In a printed circuit board on which a package having a semiconductor circuit chip is mounted, a conventional technique is known to prevent the increase in a substrate occupation area of connection wiring due to the arrangement of pins. For example, there is a printed circuit board for trying a noise level drop while suppressing the increase in the substrate occupation area, as described in Japanese Laid Open Patent Publication (JP-P2002-57418A). In this conventional technique, in the printed circuit board, a plurality of pins are electrically connected to electronic parts and are arranged in the shape of a polygon. The pin arranged at the end of the side constituting the shape of the polygon among the plurality of pins is used as a ground terminal. The pin arranged adjacent to this ground terminal is used as a power supply terminal. Moreover, a first conductor region is formed to extend in a radial manner on the same surface as the electronic part from a corner section where the ground terminal in the shape of the polygon is arranged. Thus, the first conductor region and the ground terminal are electrically connected. That is, in this conventional technique, the first conductor region extended in the radial manner from the corner section is used as the wiring.

In the arrangement of the power supply terminal and the ground terminal in the package with the conventional semiconductor circuit chip, a first power supply wiring pattern that the plurality of power supply terminals are connected on the printed circuit board intersects a second power supply wiring pattern that the plurality of ground terminals are connected on the printed circuit board. In order to attain the intersecting of the first power supply wiring pattern and the second power supply wiring pattern, a layer that the first power supply wiring pattern is formed and a layer that the second power supply wiring pattern is formed must be separated at the intersection. Since the layout of the first power supply wiring pattern and the second power supply wiring pattern on the printed circuit board is impossible in the single layer, the layout of a different wiring is made complex, which increases the number of layers and increases the cost of the printed circuit board. In addition, it is necessary to install the contact for the connection between the power supply wiring patterns contained in the different layers. However, the formation of the contact increases the resistance of the wiring, because of the existence of the contact resistance of the portion where the wiring and the contact are connected. Also, at the time of the intersecting between the first power supply wiring pattern and the second power supply wiring pattern, there is a case of making each power supply wiring pattern thinner and protecting the layers of the power supply wirings from being multiplexed. As the power supply wiring pattern is made thinner, the resistance of the thinner portion is increased. Thus, the stable power supply cannot be supplied to the package, and the performance (stability) of the printed circuit board as the system is deteriorated.

SUMMARY OF THE INVENTION

In an aspect of the present invention, a semiconductor circuit is installed on a printed circuit board having a first wiring pattern and a second wiring pattern. The semiconductor circuit includes a first power supply terminal and a first ground terminal which are provided for a first side of the semiconductor circuit, wherein the first power supply terminal is connected with the first wiring pattern and the first ground terminal is connected with the second wiring pattern; and a second power supply terminal and a second ground terminal which are provided for a second side opposing to the first side, wherein the second power supply terminal is connected with the first wiring pattern and the second ground terminal is connected with the second wiring pattern. The first and second power supply terminals, and the first and second ground terminals are arranged such that the first wiring pattern and the second wiring pattern do not intersect on in a region of the wiring substrate corresponding to the semiconductor circuit.

Here, it is preferable that a direction from the first power supply terminal to the first ground terminal and a direction from the second power supply terminal to the second ground terminal are same.

Also, first and second corner sections of the semiconductor circuit may be located on a diagonal line of the semiconductor circuit. The first power supply terminal and the first ground terminal may be arranged in a neighborhood of the first corner section, and the second power supply terminal and the second ground terminal may be arranged in a neighborhood of the second corner section.

Also, the first power supply terminal and the first ground terminal may be arranged in a neighborhood of a center of the first side, and the second power supply terminal and the second ground terminal may be arranged in neighborhood of a center of the second side.

Also, a third power supply terminal having a same voltage as the first power supply terminal may be connected with the first wiring pattern.

Also, the first wiring pattern may be connected with a signal output unit through a pull-up resistor.

Also, the second wiring pattern may be connected with an oscillator terminal through a current source and a pull-down resistor which is connected with the current source, and the current source variably controls a current in response to a control signal.

Also, the semiconductor circuit may be mounted on a package, and the first power supply terminal, the second power supply terminal, the first ground terminal and the second ground terminal may be leads of the package.

Also, the semiconductor circuit may be mounted on a package, and the first power supply terminal, the second power supply terminal, the first ground terminal and the second ground terminal may be bumps of the package.

Also, the semiconductor circuit may be formed on a semiconductor chip, and the first power supply terminal, the second power supply terminal, the first ground terminal and the second ground terminal may be electrode pads of the semiconductor chip.

In another aspect of the present invention, a semiconductor circuit includes first and second power supply terminals provided to oppose to each other and connected with a first power supply wiring pattern of a printed circuit board; and third and fourth power supply terminals provided to oppose to each other and connected with a second power supply wiring pattern of the printed circuit board. The first to fourth power supply terminals are arranged such that the first and second power supply wiring patterns do not intersect on the printed circuit board.

Here, the first to fourth power supply terminals may be arranged such that the first and second power supply wiring patterns do not intersect in a region of the printed circuit board corresponding to the semiconductor circuit. In this case, the first to fourth power supply terminals may be arranged such that a line connecting the first power supply terminal and the second power supply terminal and a line connecting the third power supply terminal and the fourth power supply terminal do not intersect.

Also, the first power supply terminal may be provided on a first side of the semiconductor circuit and the second power supply terminal is provided for a second side of the semiconductor circuit opposing to the first side.

Also, the first power supply terminal may be provided on a first side of the semiconductor circuit and the second power supply terminal is provided on a second side as one of sides of the semiconductor circuit other than the first side.

BRIEF DESCRIPTION OF THE DRAWINGS

FIG. 5A is a diagram showing SOP in an example of the package of the present invention;

FIG. 5B is a diagram showing QFP in an example of the package of the present invention;

FIG. 5C is a diagram showing BGA in an example of the package of the present invention;

FIGS. 6A to 6D are diagrams showing examples of pad arrangement on the semiconductor circuit chip of the present invention in cases of two power supplies and three power supplies;

DESCRIPTION OF THE PREFERRED EMBODIMENTS

Hereinafter, a semiconductor circuit according to the present invention will be described in detail with reference to the attached drawings.

Figure 1A:
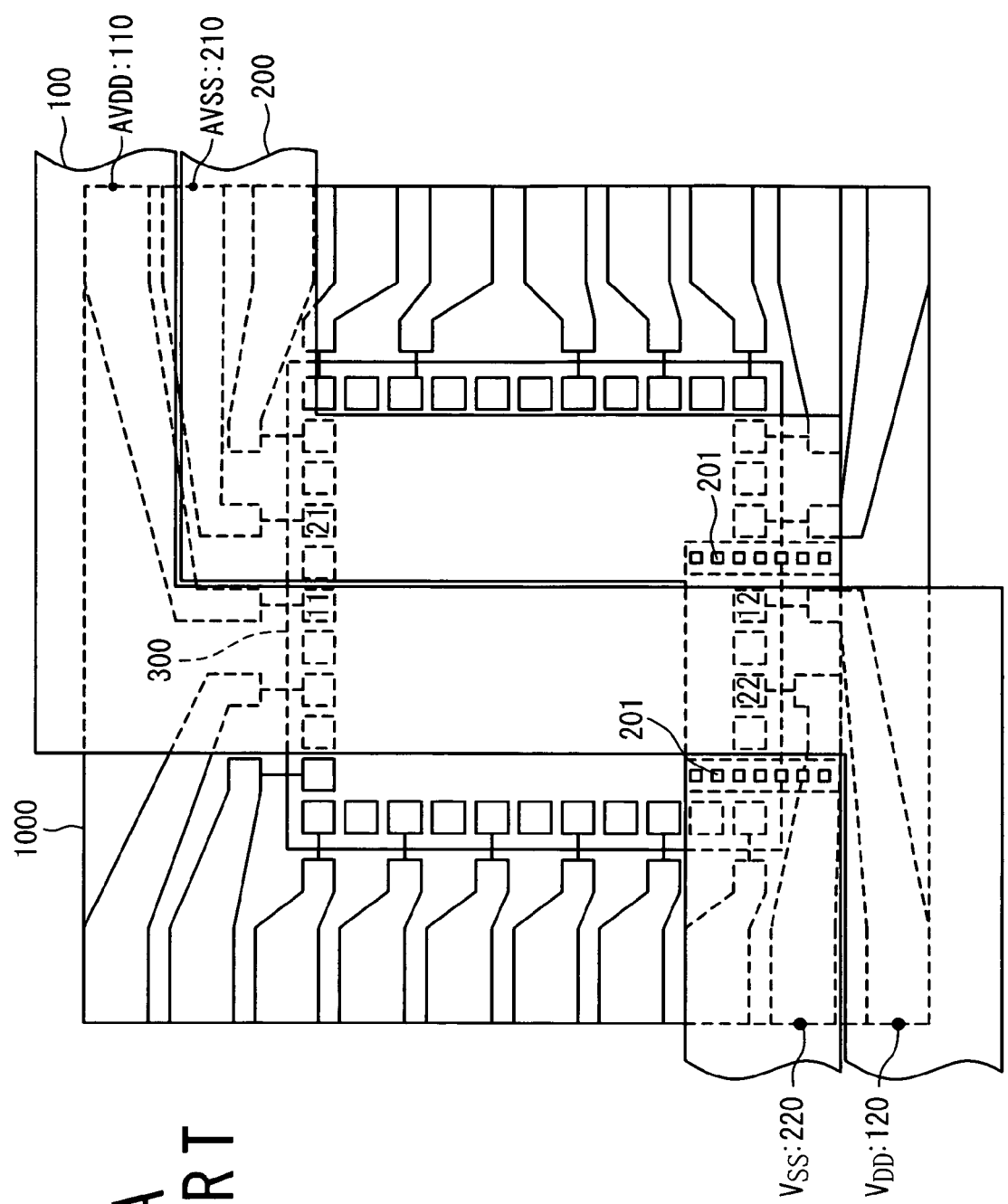
FIG. 1A is a view showing a configuration of a conventional package.
Figure 1B:
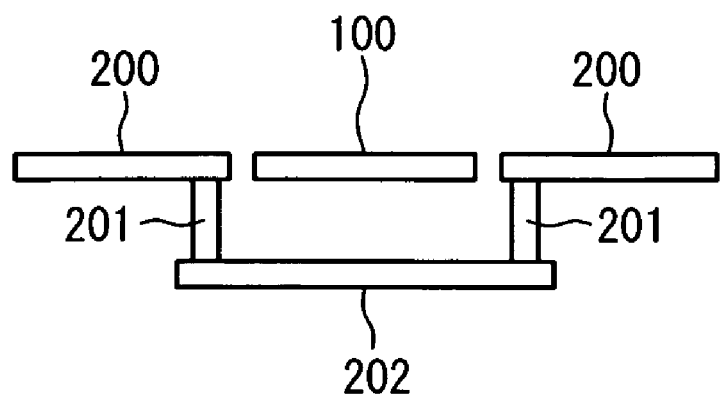
FIG. 1B is a sectional view of a portion where wirings intersect in a printed circuit board using the conventional package.
Figure 2:
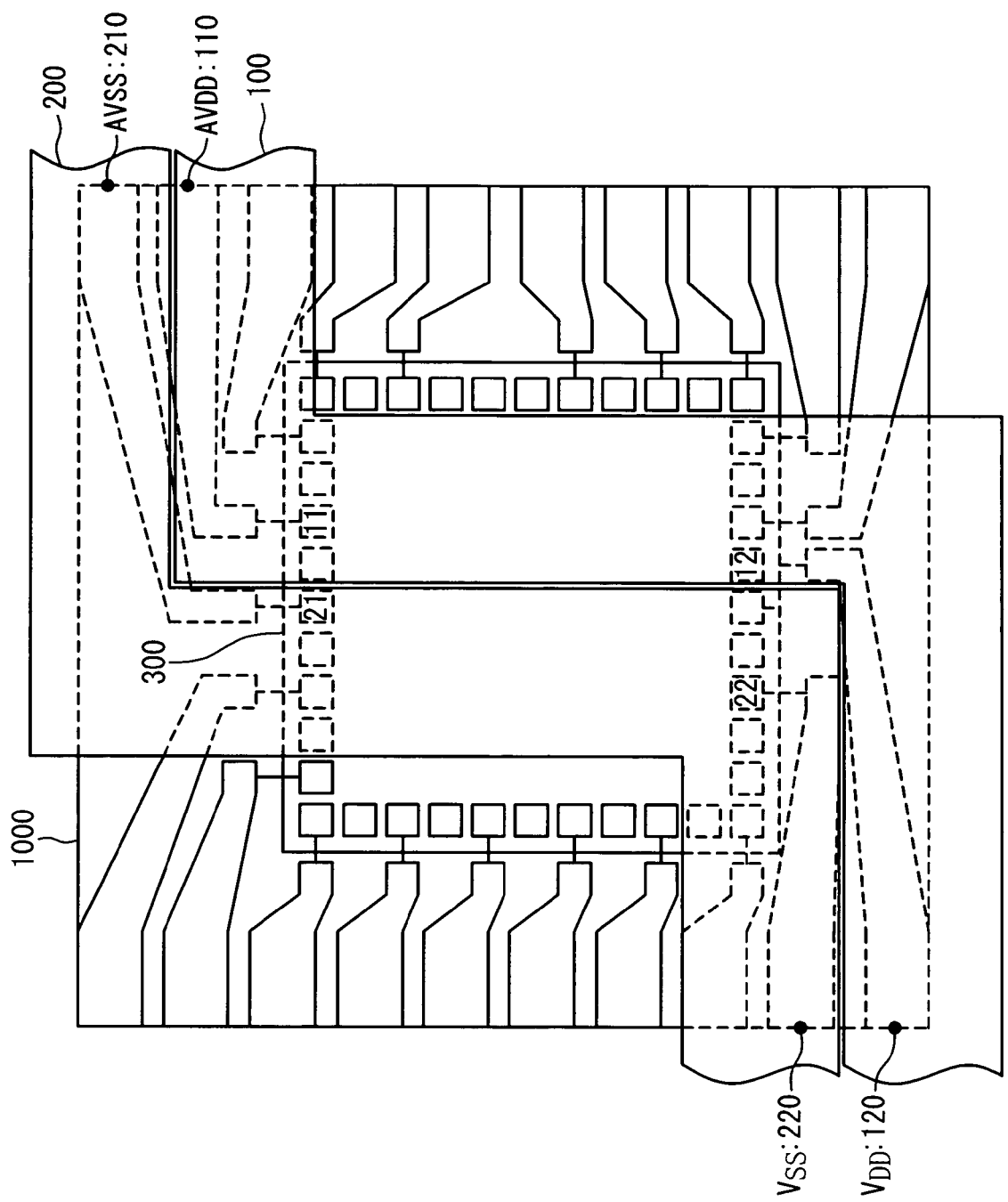
FIG. 2 is a plan diagram showing a package with a semiconductor circuit chip according to a first embodiment of the present invention.

FIG. 2 is a view of the semiconductor circuit according to the first embodiment of the present invention. A package 1000 on which a semiconductor circuit chip 300 is installed is connected to a different chip (not shown) on a printed circuit board in order to configure a system. The printed circuit board has a VDD power supply wiring 100 and a VSS power supply wiring 200, which are used to supply power to the semiconductor circuit chip 300.

The package 1000 with the semiconductor circuit chip 300 installed has a first power supply terminal (AVDD) 110 and a first ground terminal (AVSS) 210 which are used to supply power to an analog circuit, and a second power supply terminal (VDD) 120 and a second ground terminal (VSS) 220 which are used to supply power to a digital circuit. Even when the same voltage is supplied to the first power supply terminal (AVDD) 110 and the second power supply terminal (VDD) 120, those terminals are separated as different terminals for the purpose of noise countermeasure. Similarly, they are separated as the terminals different from the first ground terminal (AVSS) and the second ground terminal (VSS). The first power supply terminal (AVDD) 110 and the second power supply terminal (VDD) 120 are connected at the tip portions of the terminals (leads) to the VDD power supply wiring 100 on the printed circuit board. Similarly, the first ground terminal (AVSS) 210 and the second ground terminal (VSS) 220 are connected at the tip portions of the terminals to the VSS power supply wiring 200 on the printed circuit board. Also, the first power supply terminal (AVDD) 110 is bonded to an electrode pad (AVDD) 11 on the semiconductor circuit chip 300, and the second power supply terminal (VDD) 120 is bonded to an electrode pad (VDD) 12 on the semiconductor circuit chip 300. Similarly, the first ground terminal (AVSS) 210 is bonded to an electrode pad (AVSS) 21 on the semiconductor circuit chip 300, and the second ground terminal (VSS) 220 is bonded to an electrode pad (VSS) 22 on the semiconductor circuit chip 300. It should be noted that the bonding may be a wire bonding or a wireless bonding.

When the package 1000 with the semiconductor circuit chip 300 of the present invention is assumed to be rectangular, the first power supply terminal (AVDD) 110 and the first ground terminal (AVSS) 210 are arranged on a first side of the package 1000, and the second power supply terminal (VDD) 120 and the second ground terminal (VSS) 220 are arranged on a second side opposing to the first side. Here, the words of "the arrangement on the side" includes a case of the arrangement along the side. Also, the package 1000 has a first corner section and a second corner section which are located on a diagonal line, and the first power supply terminal (AVDD) 110 and the first ground terminal (AVSS) 210 are arranged near the first corner section, and the second power supply terminal (VDD) 120 and the second ground terminal (VSS) 220 are arranged near the second corner section. Moreover, the first power supply terminal (AVDD) 110, the first ground terminal (AVSS) 210, the second power supply terminal (VDD) 120 and the second ground terminal (VSS) 220 are arranged such that a first direction from the first power supply terminal (AVDD) 110 to the first ground terminal (AVSS) 210 is same as a second direction from the second power supply terminal (VDD) 120 to the second ground terminal (VSS) 220. Consequently, the wiring pattern of the VDD power supply wiring 100 and the wiring pattern of the VSS power supply wiring 200 can be provided such that they do not intersect each other. For example, the wiring pattern of the VDD power supply wiring 100 and the wiring pattern of the VSS power supply wiring 200 can be provided in parallel. However, it is actually adequate that the wiring pattern of the VDD power supply wiring 100 and the wiring pattern of the VSS power supply wiring 200 do not intersect within the region surrounded with the four sides of the rectangular package 1000, namely, within the region of the package defined by the points at which the leads from the semiconductor circuit chip 300 are connected to the printed circuit board. These wiring patterns are not always required to be parallel. It should be noted that the "intersection" includes a cubic intersection such as a position of distortion.

A higher voltage is supplied to the VDD power supply wiring 100, and a lower voltage is supplied to the VSS power supply wiring 200. It should be noted that the VSS power supply wiring 200 may be grounded. At this time, since the first power supply terminal (AVDD) 110 and the second power supply terminal (VDD) 120 are connected to the VDD power supply wiring 100, the voltages supplied to the first power supply terminal (AVDD) 110 and the second power supply terminal (VDD) 120 are equal to the voltage supplied to the VDD power supply wiring 100. Similarly, since the first ground terminal (AVSS) 210 and the second ground terminal (VSS) 220 are connected to the VSS power supply wiring 200, the voltages supplied to the first ground terminal (AVSS) 210 and the second ground terminal (VSS) 220 are equal to the voltage supplied to the VSS power supply wiring 200. Also, since the leads are located such that the line of VDD-AVDD and the line of VSS-AVSS, i.e., the lines connecting the tips of the leads to which the same voltages are supplied do not intersect, the VDD power supply wiring and the VSS power supply wiring do not intersect each other within the region of the package.

Figure 3:
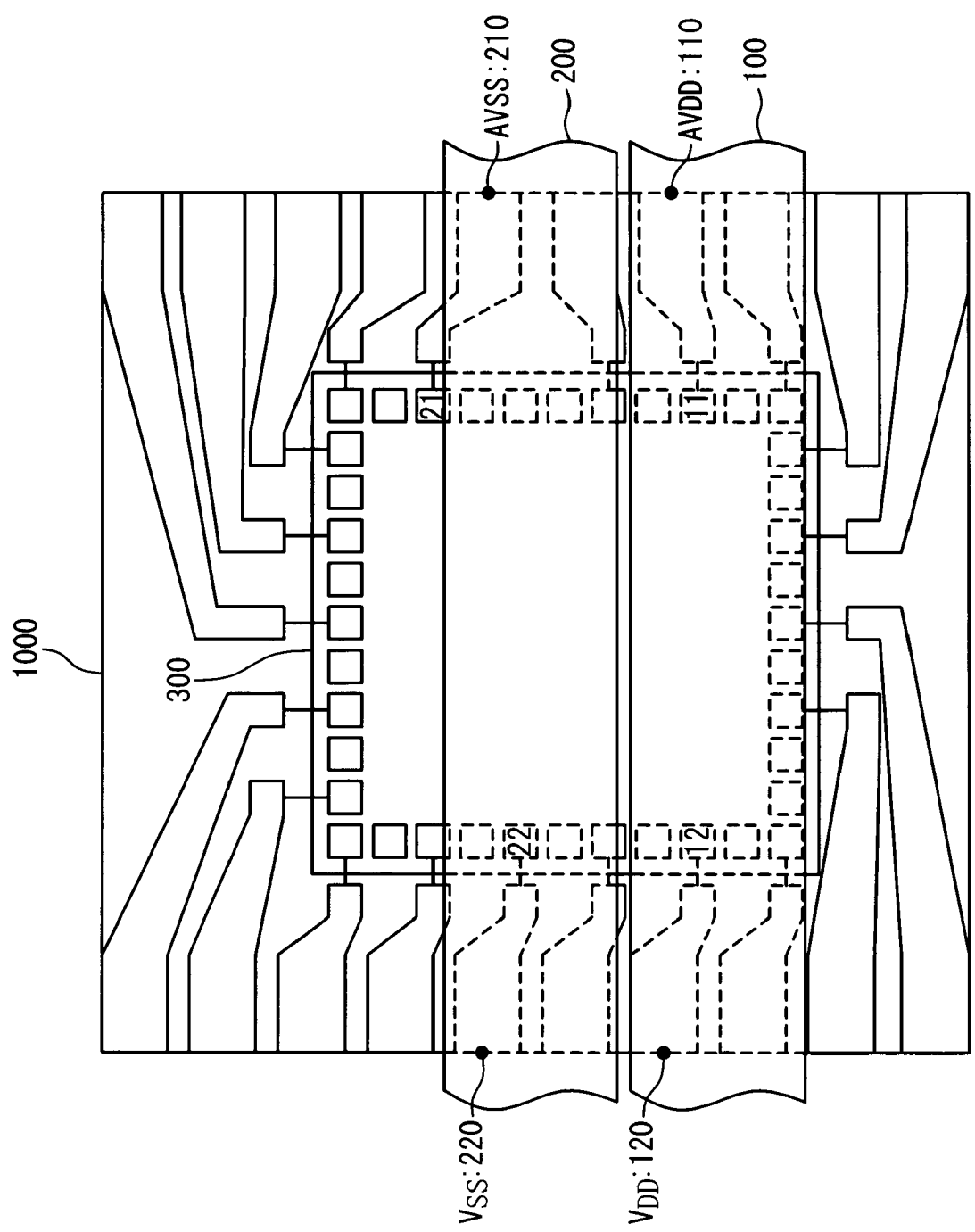
FIG. 3 is a plan diagram showing a package with a semiconductor circuit chip according to a second embodiment of the present invention.

FIG. 3 is a view of the package with the semiconductor circuit according to the second embodiment of the present invention. In the second embodiment of the present invention, the first power supply terminal (AVDD) 110 and the second power supply terminal (VDD) 120 are arranged on the package 1000 so as to oppose to each other, and the first ground terminal (AVSS) 210 and the second ground terminal (VSS) 220 are similarly arranged so as to oppose to each other. Also, the power supply wirings for the connection between the opposing terminals are located in parallel to each other. The configuration of the second embodiment is also similar to that of the first embodiment. The package 1000 with the semiconductor circuit chip 300 installed is connected to a different chip (not shown) on the printed circuit board in order to configure the system. The printed circuit board includes the VDD power supply wiring 100 and the VSS power supply wiring 200, which are used to supply the power to the semiconductor circuit chip 300.

The package 1000 with the semiconductor circuit chip 300 has the first power supply terminal (AVDD) 110 and the first ground terminal (AVSS) 210, which are used to supply power to the analog circuit, and the second power supply terminal (VDD) 120 and the second ground terminal (VSS) 220, which are used to supply power to the digital circuit. Even when the same voltage is supplied to the first power supply terminal (AVDD) 110 and the second power supply terminal (VDD) 120, they are separated as different terminals. Similarly, they are separated as terminals different from the first ground terminal (AVSS) and the second ground terminal (VSS). The first power supply terminal (AVDD) 110 and the second power supply terminal (VDD) 120 are connected at the tip portions of the terminals (leads) to the VDD power supply wiring 100 on the printed circuit board. Similarly, the first ground terminal (AVSS) 210 and the second ground terminal (VSS) 220 are connected at the tip portions of the terminals to the VSS power supply wiring 200 on the printed circuit board. Also, the first power supply terminal (AVDD) 110 is bonded to an electrode pad (AVDD) 11 on the semiconductor circuit chip 300, and the second power supply terminal (VDD) 120 is bonded to an electrode pad (VDD) 12 on the semiconductor circuit chip 300. Similarly, the first ground terminal (AVSS) 210 is bonded to an electrode pad (AVSS) 21 on the semiconductor circuit chip 300, and the second ground terminal (VSS) 220 is bonded to an electrode pad (VSS) 22 on the semiconductor circuit chip 300. It should be noted that the bonding includes the wire bonding and the wireless bonding.

In the second embodiment of the present invention, when the package 1000 with the semiconductor circuit chip 300 of the present invention is assumed to be rectangular, the first power supply terminal (AVDD) 110 and the first ground terminal (AVSS) 210 are arranged on a first side of the package 1000, and the second power supply terminal (VDD) 120 and the second ground terminal (VSS) 220 are arranged on a second side opposing to the first side. At this time, since the terminals are arranged in the centers of the respective sides, the first power supply terminal (AVDD) 110 and the second power supply terminal (VDD) 120 are arranged so as to oppose to each other. Similarly, the first ground terminal (AVSS) 210 and the second ground terminal (VSS) 220 are arranged so as to oppose to each other. Consequently, the wiring pattern of the VDD power supply wiring 100 and the wiring pattern of the VSS power supply wiring 200 can be provided on the printed circuit board so as not to intersect each other. For example, the wiring pattern of the VDD power supply wiring 100 and the wiring pattern of the VSS power supply wiring 200 can be provided in parallel. However, it is actually adequate that the wiring pattern of the VDD power supply wiring 100 and the wiring pattern of the VSS power supply wiring 200 do not intersect within the region surrounded with the four sides of the rectangular package 1000, namely, within the region of the package defined by the points at which the leads from the semiconductor circuit chip 300 are connected to the printed circuit board. These wiring patterns are not always required to be parallel. Also, since the leads are located such that the line of VDD-AVDD and the line of VSS-AVSS, i.e., the lines connecting the tips of the leads to which the same voltage is supplied do not intersect, the VDD power supply wiring and the VSS power supply wiring do not intersect each other within the region of the package.

Figure 4:
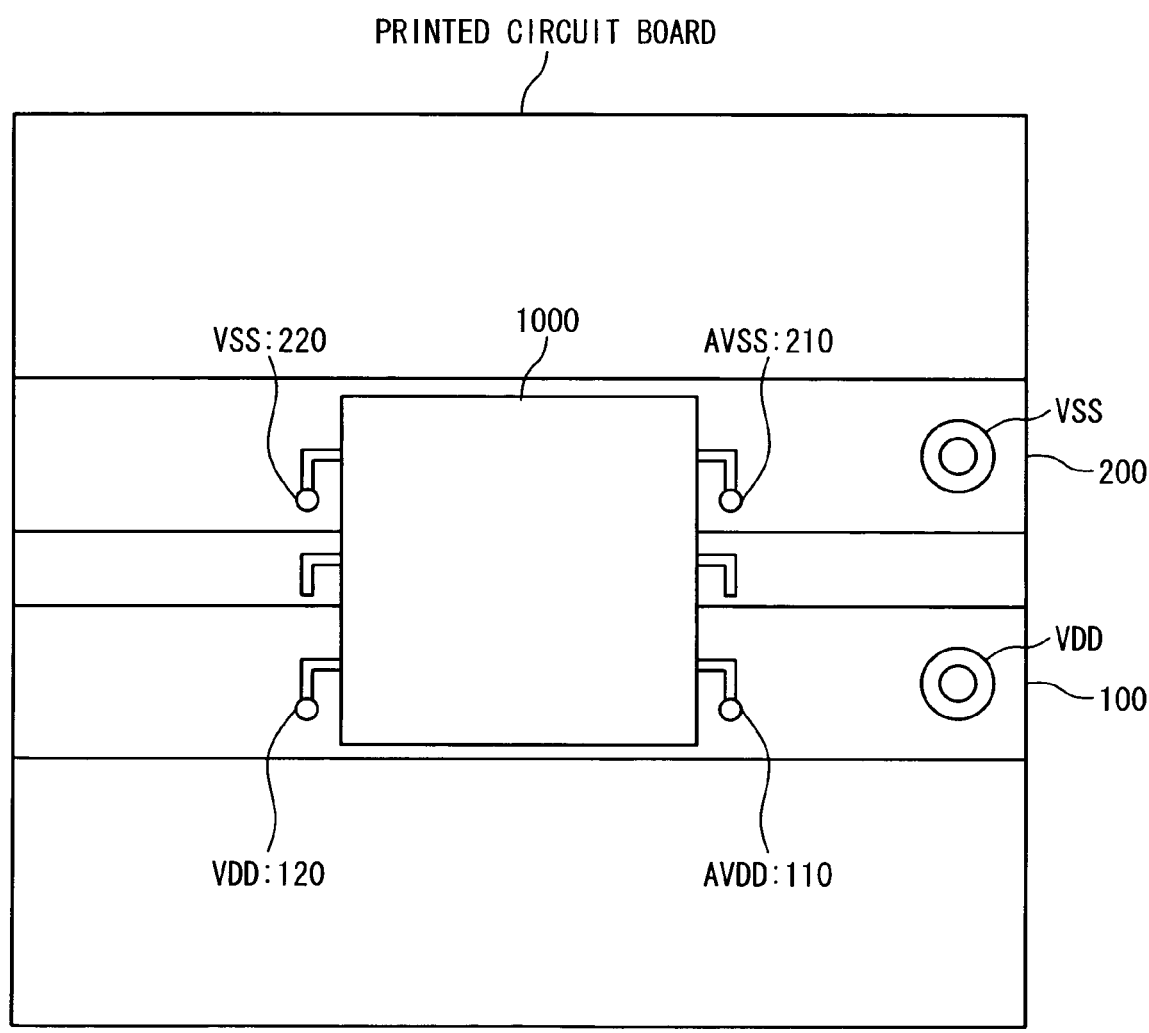
FIG. 4 is a plan view showing a printed circuit board with the package of the present invention installed.

FIG. 4 shows the relation between the package 1000 and the printed circuit board in the second embodiment of the present invention. The VDD power supply wiring 100 to which VDD power is supplied and the VSS power supply wiring 200 to which VSS power is supplied are provided. The VDD power supply wiring 100 and the VSS power supply wiring 200 may be the wiring patterns. The package 1000 with the semiconductor circuit chip 300 is mounted on the printed circuit board. The first power supply terminal (AVDD) 110 and the second power supply terminal (VDD) 120 in the package 1000 are connected to the VDD power supply wiring 100. Also, the first ground terminal (AVSS) 210 and the second ground terminal (VSS) 220 in the package 1000 are connected to the VSS power supply wiring 200. Thus, the power is supplied from the VDD power supply to the first power supply terminal (AVDD) 110 and the second power supply terminal (VDD) 120, and the power is supplied from the VSS power supply to the first ground terminal (AVSS) 210 and the second ground terminal (VSS) 220. It should be noted that in FIG. 4, the second embodiment of the present invention is shown, but the first embodiment is similar.

FIGS. 5A to 5C show examples of the package of the present invention.

FIG. 5A show a SOP (Small Outline Package) package in which terminals (electrode leads) are taken out from the two sides of the package 1000. The terminals taken out from the two sides are arranged at the positions described in the first or second embodiment.

FIG. 5B shows a QFP (Quad Flat Package) package in which terminals (electrode leads) are arranged on the four sides of the package 1000. Also, in case of the QFP package, like the SOP package, attention is paid to the terminals taken out from the facing two sides, such that those terminals are arranged at the positions described in the first or second embodiment.

FIG. 5C shows a BGA (Ball Grid Array) package, in which outer terminals (bumps) arrayed in the shape of grids are formed on the rear of the package 1000, thereby increasing the number of pins and making the density higher. As the example of the bump, there is a solder ball. In case of the BGA package, when the package 1000 with the semiconductor circuit chip 300 of the present invention is assumed to be rectangular, the package 1000 has the first corner section and the second corner section which are located on the diagonal line of the rectangle, and at least one of the bumps arranged near the first corner section is assumed to be the first power supply terminal (AVDD) 110, and at least one of the bumps arranged near the first power supply terminal (AVDD) 110 is assumed to the first ground terminal (AVSS) 210. Similarly, at least one of the bumps arranged near the second corner section is assumed to be the second power supply terminal (VDD) 120, and at least one of the bumps arranged near the second power supply terminal (VDD) 120 is assumed to be the second ground terminal (VSS) 220. At this time, a direction from the first power supply terminal (AVDD) 110 to the first ground terminal (AVSS) 210 and a direction from the second power supply terminal (VDD) 120 to the second ground terminal (VSS) 220 are coincident with each other. At this time, when the bumps are arranged such that the line of VDD-AVDD and the line of VSS-AVSS do not intersect each other, the VDD power supply wiring and the VSS power supply wiring do not intersect each other within the region of the package. It should be noted that actually, the package 1000 of the present invention is not limited to the reference example. The package 1000 having the terminals connected to the VDD power supply wiring and the terminals connected to the VSS power supply wiring may be adequate.

Also, similarly to the arrangement of the respective terminals in the package 1000 of the present invention, the electrode pads on the semiconductor circuit chip 300 can be also arranged. At this time, each of the terminals in the semiconductor circuit chip 300 is bonded to a corresponding electrode pad. The bonding includes the wire bonding and the wireless bonding. The semiconductor circuit chip 300 of the present invention includes the electrode pad (AVDD) 11, the electrode pad (VDD) 12, the electrode pad (AVSS) 21 and the electrode pad (VSS) 22. The electrode pad (AVDD) 11 is connected to the first power supply terminal (AVDD) 110. The electrode pad (VDD) 12 is connected to the second power supply terminal (VDD) 120. The electrode pad (AVSS) 21 is connected to the first ground terminal (AVSS) 210. The electrode pad (VSS) 22 is connected to the second ground terminal (VSS) 220.

When the semiconductor circuit chip 300 of the present invention is assumed to be rectangular, the electrode pad (AVDD) 11 and the electrode pad (AVSS) 21 are arranged on a first side of the semiconductor circuit chip 300. Similarly, the electrode pad (VDD) 12 and the electrode pad (VSS) 22 are arranged on a second side opposing to the first side. Here, the arrangement on the side includes the arrangement along the side. Moreover, the semiconductor circuit chip 300 has the first corner section and the second corner section which are located on the diagonal lines of the rectangle, and the electrode pad (AVDD) 11 and the electrode pad (AVSS) 21 are arranged near the first corner section. Also, the electrode pad (VDD) 12 and the electrode pad (VSS) 22 are arranged near the second corner section. When a first direction from the electrode pad (AVDD) 11 to the electrode pad (AVSS) 21 and a second direction from the electrode pad (VDD) 12 to the electrode pad (VSS) 22 are coincident with each other. Consequently, the arrangement of the respective terminals in the package 1000 of the present invention is easy, and even for the semiconductor circuit chip 300, the wiring pattern of the VDD power supply wiring 100 and the wiring pattern of the VSS power supply wiring 200 can be installed so as not to intersect each other.

FIGS. 6A to 6D show examples of the pad arrangement on the semiconductor circuit chip 300 of the present invention. In the semiconductor circuit chip 300, the electrode pad (AVDD) 11 and the electrode pad (AVSS) 21 are arranged on the first side of the semiconductor circuit chip 300. Also, in addition to the electrode pad (VDD) 12 and the electrode pad (VSS) 22, an electrode pad (REGC) 30, an electrode pad (X1 terminal) 31 and an electrode pad (X2 terminal 32) are further arranged on the second side facing the first side. By the way, the electrode pad (REGC) 30, the electrode pad (X1 terminal) 31 and the electrode pad (X2 terminal) 32 are installed near the electrode pad (VDD) 12 and the electrode pad (VSS) 22. The power is supplied from the VDD power supply to the electrode pad (AVDD) 11 and the second power supply terminal (VDD) 120. The power is supplied from the VSS power supply to the first ground terminal (AVSS) 210 and the second ground terminal (VSS) 220. The electrode pad (REGC) 30 is an electrode pad of an REGC terminal connected to a regulator. The electrode pad (X1 terminal) 31 and the electrode pad (X2 terminal) 32 are the electrode pads of oscillator terminals connected to an oscillator such as a crystal oscillator in which a crystal quartz is used.

FIG. 6A is a first example of two power supplies in which the electrode pad (VSS) 22 and the electrode pad (REGC) 30 adjacent to the electrode pad 22 are same in voltage. In the first example, the electrode pad (AVDD) 11 and the electrode pad (VDD) 12 are connected to the VDD power supply wiring 100, and the electrode pad (AVSS) 21, the electrode pad (VSS) 22 and the electrode pad (REGC) 30 are connected to the VSS power supply wiring 200. It should be noted that the electrode pad (X1 terminal) 31 and the electrode pad (X2 terminal) 32 may be connected to the VSS power supply wiring 200, if they are coincident with the voltage of the electrode pad (VSS) 22. Also, in this case, the width of the VSS power supply wiring 200 is always kept constant to prevent the impedance to increase at the thin portion of the power supply wiring.

FIG. 6B is a second example of three power supplies in which the electrode pad (VSS) 22 and the electrode pad (REGC) 30 adjacent to the electrode pad 22 are different in voltage. In the second example, the electrode pad (AVDD) 11 and the electrode pad (VDD) 12 are connected to the VDD power supply wiring 100, and the electrode pad (AVSS) 21 and the electrode pad (VSS) 22 are connected to the VSS power supply wiring 200. Here, the electrode pad (REGC) 30 is not connected to the VSS power supply wiring 200, and this is connected to a signal line of the regulator. The voltage of the electrode pad (REGC) 30 is equal to the voltage of the signal supplied from this signal line.

A case where an electrode pad (AVREF) 40 connected to a third power supply terminal (AVREF) to which a voltage from a reference power supply is supplied is provided on the first side on which the electrode pad (AVDD) 11 and the electrode pad (AVSS) 21 are provided will be described below.

FIG. 6C is a third example of two power supplies in which the electrode pad (AVDD) 11 and the electrode pad (AVREF) 40 are coincident with each other in voltage. In the third example, the electrode pad (AVDD) 11, the electrode pad (AVSS) 21 and the electrode pad (AVREF) 40 are provided on the first side, and the electrode pad (VDD) 12, the electrode pad (VSS) 22, the electrode pad (REGC) 30, the electrode pad (X1 terminal) 31 and the electrode pad (X2 terminal) 32 are provided on the second side. The electrode pad (AVDD) 11, the electrode pad (VDD) 12 and the electrode pad (AVREF) 40 are connected to the VDD power supply wiring 100, and the electrode pad (AVSS) 21, the electrode pad (VSS) 22 and the electrode pad (REGC) 30 are connected to the VSS power supply wiring 200. At this time, the power is supplied from the VDD power supply to the first power supply terminal (AVDD) 110, the second power supply terminal (VDD) 120 and the third power supply terminal (AVREF) 40. Also, the power is supplied from the VSS power supply to the first ground terminal (AVSS) 210, the second ground terminal (VSS) 220 and the electrode pad (REGC) 30.

FIG. 6D is a fourth case of three power supplies in which the electrode pad (AVDD) 11 and the electrode pad (AVREF) 40 are different in voltage. In the fourth example, the electrode pad (AVDD) 11, the electrode pad (AVSS) 21 and the electrode pad (AVREF) 40 are provided on the first side, and the electrode pad (VDD) 12, the electrode pad (VSS) 22, the electrode pad (REGC) 30, the electrode pad (X1 terminal) 31 and the electrode pad (X2 terminal) 32 are provided on the second side. The electrode pad (AVDD) 11 and the electrode pad (VDD) 12 are connected to the VDD power supply wiring 100. The power which is different from any of the VDD power supply wiring 100 and the VSS power supply wiring 200 is supplied from the connected power supply wiring to the third power supply terminal (AVREF) 40. The electrode pad (AVSS) 21, the electrode pad (VSS) 22 and the electrode pad (REGC) 30 are connected to the VSS power supply wiring 200. At this time, the power is supplied from the VDD power supply to the first power supply terminal (AVDD) 110 and the second power supply terminal (VDD) 120. Similarly, the power is supplied from the power supply of the same VSS group to the first ground terminal (AVSS) 210, the second ground terminal (VSS) 220 and the electrode pad (REGC) 30. It should be noted that the description in FIGS. 6A to 6D describes the arrangement of the respective electrode pads in the semiconductor circuit chip 300. However, the similar arrangement can be applied to the arrangement of the respective terminals of the package 1000. In this case, in the description in FIG. 6A to 6D, the semiconductor circuit chip 300 is changed to the package 1000, and the electrode pad is changed to the corresponding terminal. For example, the electrode pad (AVDD) 11 is changed to the first power supply terminal (AVDD) 110.

The internal circuit in the semiconductor circuit chip 300 of the present invention will be described below by dividing the power supply into the VDD power supply and the VSS power supply. Here, the VDD power supply wiring indicates the power supply wiring, the power supply terminal, the ground terminal and the signal electrode pad to which the power is supplied from the power supply of the VDD group.

Figure 7A:
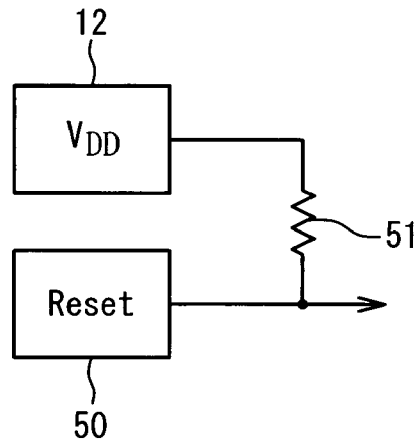
FIG. 7A is a diagram showing an electrode pad (VDD) connected through a pull-up resistor to an electrode pad (Reset)
Figure 7B:
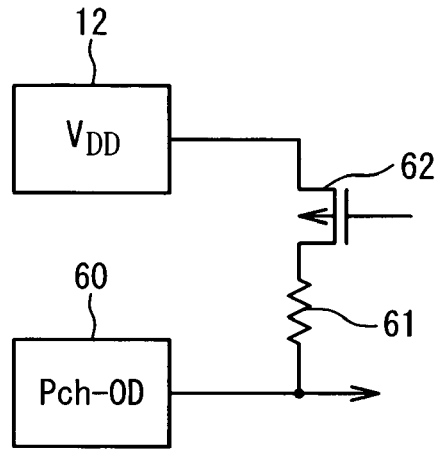
FIG. 7B is a diagram showing an electrode pad (VDD) connected through a P-channel transistor and a pull-up resistor to an electrode pad (Pch-OD)

As for the VDD power supply, as shown in FIG. 7A, the electrode pad (VDD) 12 is connected through a pull-up resistor 51 to an electrode pad (Reset) 50 to which a reset signal is inputted. Also, as shown in FIG. 7B, the electrode pad (VDD) 12 is connected through a P-channel transistor 62, a pull-up resistor 61 to an electrode pad (Pch-OD) 60 to which a signal serving as a P-channel open drain output is inputted. At this time, the electrode pad (Pch-OD) 60 and the pull-up resistor 61 are connected, the pull-up resistor 61 and the drain side of the P-channel transistor 62 are connected, and the source side of the P-channel transistor 62 and the electrode pad (VDD) 12 are connected. It should be noted that the electrode pad (VDD) 12 may be the VDD power supply wiring 100.

Figure 8A:
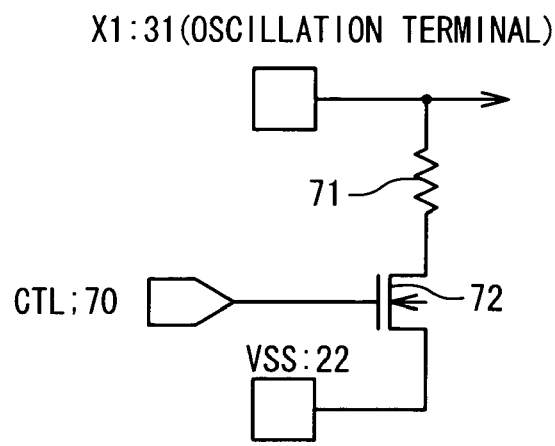
FIG. 8A is a diagram showing X1 (a terminal for an oscillator) connected through a pull-down resistor and an N-channel transistor to an electrode pad (VSS)
Figure 8B:
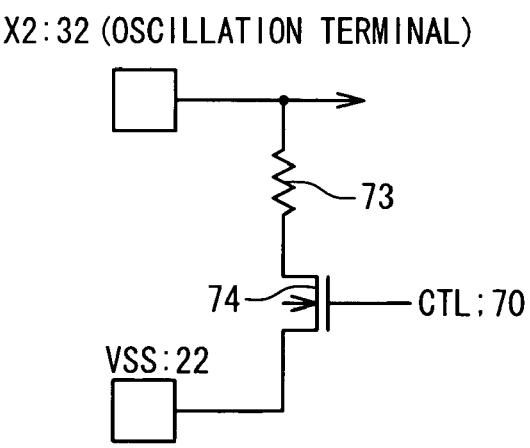
FIG. 8B is a diagram showing X2 (a terminal for an oscillator) connected through a pull-down resistor and an N-channel transistor to an electrode pad (VSS)

Also, as for the VSS power supply, as shown in FIG. 8A, the electrode pad (X1 terminal) 31 is connected through a pull-down resistor 71 and an N-channel transistor 72 as a current source to the electrode pad (VSS) 22. At this time, the electrode pad (X1 terminal) 31 and the pull-down resistor 71 are connected, the pull-down resistor 71 and the drain side of the N-channel transistor 72 are connected, and the source side of the N-channel transistor 72 is connected to the electrode pad (VSS) 22. Also, a control signal (CTL) 70 is supplied to the gate of the N-channel transistor 72 to variably control a current. Also, as shown in FIG. 8B, the electrode pad (X2 terminal) 32 is connected through a pull-down resistor 73 and an N-channel transistor 74 as a current source to the electrode pad (VSS) 22. At this time, the electrode pad (X1 terminal) 31 and the pull-down resistor 73 are connected, the pull-down resistor 73 and the drain side of the N-channel transistor 74 are connected, and the source side of the N-channel transistor 74 is connected to the electrode pad (VSS) 22. Also, the control signal (CTL) 70 is supplied to the gate of the N-channel transistor 74 to variably control a current. It should be noted that the electrode pad (VSS) 22 may be the VSS power supply wiring 200. Also, the electrode pad (VSS) 22 may be grounded.

Figure 9A:
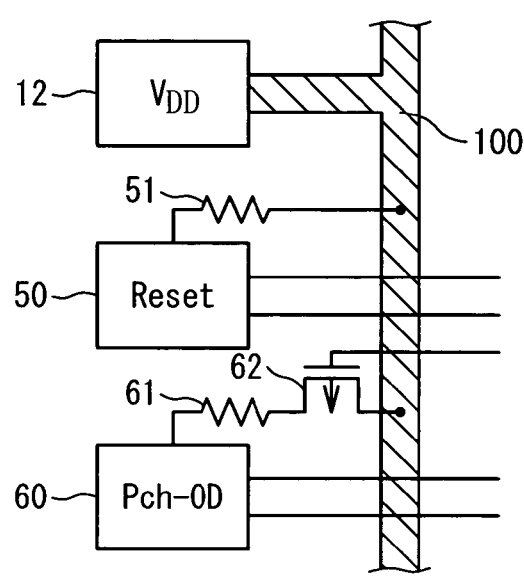
FIGS. 9A and 9B are layout diagrams showing the VDD power supply shown in FIGS. 7A and 7B and the VSS power supply shown in FIGS. 8A and 8B.
Figure 9B:
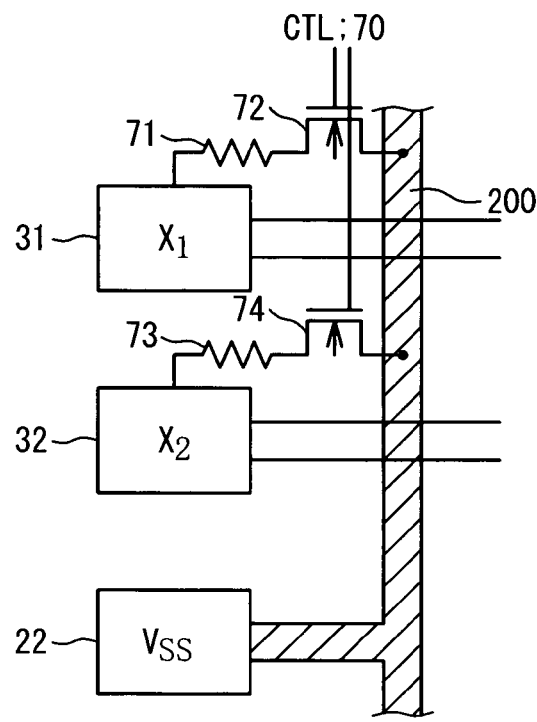

FIGS. 9A and 9B are the layout diagrams showing the VDD power supply shown in FIGS. 7A and 7B and the VSS power supply shown in FIGS. 8A and 8B. FIG. 9A is the layout diagram of the VDD power supply. Here, the electrode pad (VDD) 12 shown in FIG. 7A and the pull-up resistor 51 are connected through the VDD power supply wiring 100. Similarly, the electrode pad (VDD) 12 and the P-channel transistor 62 shown in FIG. 7B are connected through the VDD power supply wiring 100. Also, FIG. 9B is the layout diagram of the VSS power supply. Here, the source of the power supply transistor 72 shown in FIG. 8A is connected through the VSS power supply wiring 200 to the electrode pad (VSS) 22. Similarly, the source of the N-channel transistor 74 is connected through the VSS power supply wiring 200 to the electrode pad (VSS) 22. It should be noted that the electrode pad (VSS) 22 and the VSS power supply wiring 200 may be grounded.

When the terminals of the VDD power supply and the VSS power supply are mixed and arranged, both of the wirings for the VDD power supply and the VSS power supply must be arranged in the peripheral region of the chip, which results in the increase in the chip size. For this reason, the terminals of the VDD power supply are collectively arranged, and the terminals of the VSS power supply are collectively arranged. Consequently, only the arrangement of the respective wirings is necessary.

As mentioned above, since the terminals of the VDD power supply and the terminals of the VSS power supply are arranged as in the package of the present invention, the VDD power supply wiring and the VSS power supply wiring can be arranged in the single layer without any intersecting between them. When the VDD power supply wiring and the VSS power supply wiring intersect each other, if the VDD power supply wiring is arranged in a first layer and the VSS power supply wiring is arranged in a second layer, the other signal lines are consequently provided in the third or additional layer. However, if the VDD power supply wiring and the VSS power supply wiring can be arranged in the first layer, the other signal lines can be laid in the second layer. Thus, the number of wiring layers can be reduced in the multi-layer printed circuit board. Also, if the VDD power supply wirings and the VSS power supply wiring can be arranged without any intersecting between them, the respective power supply wirings are not required to be made thinner, which can suppress the increase in the impedance caused by the configuration that the power supply wiring is made thinner.

In the printed circuit board, if the wiring pattern of the power supply wiring is formed as two layers, via-contacts must be formed, and they must be laid around. Thus, a labor for designing is required, and excessive resistances and capacitances are further added to the power supply wiring. In the printed circuit board for mounting the package with the chip according to the present invention, the wiring pattern of the power supply wiring can be formed as a single layer, and the pattern designing becomes easier and the width of the power supply wiring is not required to be changed. Therefore, it is possible to protect the increase in the impedance of the power supply wiring.

What is claimed is:

1. A semiconductor circuit installed on a printed circuit board having a first wiring pattern and a second wiring pattern, comprising:

a first power supply terminal and a first ground terminal which are provided for a first side of said semiconductor circuit, wherein said first power supply terminal is connected with said first wiring pattern and said first ground terminal is connected with said second wiring pattern; and a second power supply terminal and a second ground terminal which are provided for a second side opposing to said first side, wherein said second power supply terminal is connected with said first wiring pattern and said second ground terminal is connected with said second wiring pattern, wherein said first and second power supply terminals, and said first and second ground terminals are arranged such that said first wiring pattern and said second wiring pattern do not intersect in a region of said wiring substrate corresponding to said semiconductor circuit, and wherein said second wiring pattern is connected with an oscillator terminal through a current source and a pull-down resistor which is connected with the current source, and said current source variably controls a current in response to a control signal.

2. The semiconductor circuit according to claim 1, wherein a direction from said first power supply terminal to said first ground terminal and a direction from said second power supply terminal to said second ground terminal are same.

3. The semiconductor circuit according to claim 1, wherein first and second corner sections of said semiconductor circuit are located on a diagonal line of said semiconductor circuit, said first power supply terminal and said first ground terminal are at said first corner section, and said second power supply terminal and said second ground terminal are at said second corner section.

4. The semiconductor circuit according to claim 1, wherein said first power supply terminal and said first ground terminal are at a center of said first side, and
said second power supply terminal and said second ground terminal are at a center of said second side.

5. The semiconductor circuit according to claim 1, wherein a third power supply terminal having a same voltage as said first power supply terminal is connected with said first wiring pattern.

6. The semiconductor circuit according to claim 1, wherein said first wiring pattern is connected with a signal output unit through a pull-up resistor.

7. The semiconductor circuit according to claim 1, wherein said semiconductor circuit is mounted on a package, and
said first power supply terminal, said second power supply terminal, said first ground terminal and said second ground terminal are leads of said package.

8. The semiconductor circuit according to claim 1, wherein said semiconductor circuit is mounted on a package, and
said first power supply terminal, said second power supply terminal, said first ground terminal and said second ground terminal are bumps of said package.

* * * * *